United States Patent [19]

Roos

[11] 3,778,270

[45] Dec. 11, 1973

[54] PHOTOSENSITIVE BIS-DIAZONIUM SALT COMPOSITIONS AND ELEMENTS

[75] Inventor: Leo Roos, New Shrewsbury, N.J.

[73] Assignee: E. I. du Pont de Nemours and Company, Wilmington, Del.

[22] Filed: Nov. 12, 1970

[21] Appl. No.: 89,133

Related U.S. Application Data

[63] Continuation-in-part of Ser. No. 833,774, June 16, 1969, abandoned.

[52] U.S. Cl. .......................... 96/75, 96/28, 96/35.1, 96/36, 96/91 R, 96/115 R, 260/141

[51] Int. Cl. ............. 96 36.3, G03f 7/08, G03c 1/54

[58] Field of Search ................. 96/91 R, 75, 115 R, 96/28, 35.1, 115 P, 33, 36.3, 36; 260/141, 142, 2.5 R, 2.5 AE

[56] References Cited

UNITED STATES PATENTS

| | | | |
|---|---|---|---|
| 3,110,592 | 11/1963 | Schwerin et al. | 96/35.1 |
| 2,772,160 | 11/1956 | Hepher | 96/91 X |
| 2,780,547 | 2/1957 | Ferzola et al. | 96/91 R X |
| 1,971,966 | 8/1934 | Koishikawa | 96/91 R |
| 3,615,538 | 10/1971 | Peters | 96/35.1 |
| 3,174,860 | 3/1965 | Sus et al. | 96/91 R X |
| 2,695,846 | 11/1954 | Mally | 96/91 N X |
| 3,494,767 | 2/1970 | Laridon et al. | 96/91 D |
| 1,943,377 | 1/1934 | Ellis | 96/91 R X |
| 2,522,771 | 9/1950 | Barnes et al. | 96/91 R X |
| 2,729,562 | 1/1956 | Zamp | 96/91 R X |
| 2,890,115 | 6/1959 | Sus et al. | 96/91 X |
| 2,892,712 | 6/1959 | Plambeck | 96/35.1 |
| 3,573,917 | 4/1971 | Okamoto | 96/91 D X |
| 3,219,447 | 11/1965 | Neugebauer et al. | 96/91 R X |

OTHER PUBLICATIONS

Schoutissen, H. A. J., "J.A.C.S.," Vol. 55, 11/1933, pp. 4,535–4,541 relied on.

Dinaburg, M. S., "Photosensitive Diazo Compounds," 1964, The Focal Press, pp. 28 and 169 relied on.

*Primary Examiner*—Charles L. Bowers, Jr.
*Attorney*—James T. Corle

[57] ABSTRACT

A crosslinkable-photosensitive composition which comprises a bis-diazonium salt with a natural or synthetic macromolecular organic polymer having pendant reactive groups. The compositions are useful in elements for the preparation of relief images, photoresist applications, etc.

10 Claims, No Drawings

PHOTOSENSITIVE BIS-DIAZONIUM SALT COMPOSITIONS AND ELEMENTS

This application is a continuation-in-part of Ser. No. 833,774, filed June 16, 1969, now abandoned.

BACKGROUND OF THE INVENTION

This invention relates to novel photosensitive compositions and more particularly to such compositions containing a non-light sensitive binder, and a photosensitive bis-diazonium salt. This invention also pertains to a novel photoresist element utilizing these compositions.

It is well known in the art of photoresists to utilize polymeric coatings on various supports such as metallic plates as photoresist elements. Upon imagewise exposure, the commonly used photoresists become insolubilized in the exposed areas. These areas will not be washed off, as are the unexposed areas, upon development of the plate in an organic solvent. These commonly used photoresists are usually applied as liquids or require one or more liquid operations in addition to the liquid development step. Polymers used in these liquid resists have been sensitized by the use of photosensitive azides, dichromates or cinnamoyl esters in conjunction therewith.

In Assignee's U.S. applications, Celeste, U.S. Pat. No. 3,469,982, Sept. 30, 1969, and Schoenthaler, U.S. Pat. No. 3,418,295 of Dec. 24, 1968, there are disclosed elements for use in a photoresist process which do not require liquid sensitization or application operations. These elements involve a photopolymerizable layer containing an ethylenically unsaturated compound having low to moderate adherence to a film support and may be provided with a different protective film or membrane having less adherence to the layer.

It is desirable in some instances to use a photoresist composition which is of the dry type, but which becomes insoluble in the areas which are unexposed, thus providing a positive working photoresist element.

SUMMARY OF THE INVENTION

It is an object of the present invention to provide a novel crosslinkable-photosensitive composition and element. A further object of this invention is to provide bis-diazonium salts useful in such elements and compositions. Still further, objects will become apparent from the following specification and claims.

The crosslinkable-photosensitive compositions of this invention comprise a mixture of 1. a crosslinkable polymer of copolymer consisting of synthetic or naturally occurring macromolecular organic colloid having pendent recurring hydroxyl or amino groups, and
2. a bis-diazonium salt wherein the cation portion of the salt is of the formula:

$$N^+ \equiv N - R - (RX)_q - N \equiv N^+$$

wherein $q$ is 0 or 1, $R$ is an aromatic hydrocarbon or polynuclear quinone nucleus or a heterocyclic nucleus of aromatic character, and $X$ is an alkylene, arylene, azo or sulfone group, and in the special case when $q$ is 1 and $R$ is aroyl or arylsulfonyl, then $X$ is either alkylenedioxy or arylenedioxy.

Suitable aromatic nuclei are benzene, napthalene, acenapthene, anthracene, and phenanthrene. Suitable polynuclear quinone nuclei are anthraquinone and phenanthraquinone, and suitable heterocyclic nuclei are pyrazole and acridine. The nuclei may be substituted, e.g., by Cl, Br, alkyl of 1 to 4 carbons, and alkoxy of one to four carbon atoms, including methyl, ethyl, propyl, and butyl, and the corresponding alkoxy radicals. Among the useful alkylene radicals are tetramethylene and polymethylene of five to 18 carbons. Suitable arylenes are phenylene and napthylene.

Preferred compounds have a cation of the formula $$N^+ \equiv N - R' - Y - (CH_2)_n - Y - R' - N \equiv N^+$$

wherein $R'$ is a benzene, napthalene, anthracene or phenanthrene radical, $Y$ is —COO— or —$SO_3$—, $n$ is four to 18, and $R'$ is attached to the carbon or sulfur atom of —COO— or —$SO_3$— respectively. Suitable salt-forming compounds are zinc chloride, and acids or salts wherein the anion is fluoborate, sulfate, fluosulfonate, oxalate, citrate, etc.

Photoresist elements are prepared by coating the photosensitive-crosslinkable compositions on a suitable support by any of the methods well known in the prior art. The composition and element are used in a process for preparing a positive working photoresist as described in Assignee's copending application of Cohen and Heiart, filed June 16, 1969, Ser. No. 833,740, now abandoned.

The crosslinkable-photosensitive compositions and elements of the present invention differ from the prior art in that upon imagewise exposure, the areas struck by light become desensitized. The desensitized areas will not crosslink and remain soluble when the element is subsequently treated with basic fumes or a basic solution. Thus the exposed areas will wash out upon development of the element in an organic or aqueous solvent.

DESCRIPTION OF THE PREFERRED EMBODIMENTS

Photosensitive bis-diazonium salts of this invention can be prepared and used in a layer in combination with a colloid as a crosslinkable-photosensitive composition. The following bis-diazonium salts are useful in the elements of this invention:

(1,4-butanediol) dibenzoate-4,4'-bis(diazonium zinc chloride)
(1,5-pentanediol)dinapthoate-5,5'-bis(diazonium zinc chloride)
(1,4-butanediol)dinapthylsulfonate-4,4'-bis(diazonium fluoborate)
(1,4-butanediol)dinapthyl-6-sulfonate-2,2'-bis[methyl]-1,1'-bis(diazonium fluoborate)
resorcinol dibenzoate-4,4'-bis(diazonium zinc chloride)
(2,4-pyridinediol) dibenzoate-4,4'-bis(diazonium zinc chloride)
benzene-1,4-bis(diazonium fluoborate)
benzene-1,3-bis(diazoniun fluoborate)
napthalene-1,5-bis(diazonium fluoborate)
napthalene-1,5-bis(diazonium fluoborate)-7-sulfonic acid
anthracene-1,6-bis(diazonium fluoborate)
anthracene-1,5-bis(diazonium fluoborate)-7-sulfonic acid
anthraquinone-1,6-bis(diazonium fluoborate)
phenanthrene-1,5-bis(diazonium fluoborate)
fluorene-2,7-bis(diazonium fluoborate)

acenaphthene-4,6-bis(diazonium fluoborate)
2,6-dimethoxypyridine-3,5-bis(diazonium fluoborate)
pyrazole-3,5-bis(diazonium fluoborate)
acridine-3,6-bis(diazonium fluoborate)
biphenyl-4,4'-bis(diazonium fluoborate)
biphenyl-4,4'-bis(diazonium fluoborate)-2,2'-bis sulfonic acid
2,2'-dimethyl-biphenyl-4,4'-bis(diazonium fluoborate)
diphenylmethane-4,4'-bis(diazonium fluoborate)
1,2-diphenylethane-4,4'-bis(diazonium fluoborate)
1,3-diphenylisobutane-4,4'-bis(diazonium fluoborate)
p-terphenyl-4,4'-bis(diazonium fluoborate)
diphenylsulphone-4,4'-bis(diazonium fluoborate)
azobenzene-4,4'-bis(diazonium fluoborate)

An exemplary procedure and a preferred method for making the salts is by diazotization of the respective bis-amines and specific examples of preparation of the salts and their use in crosslinkable-photosensitive compositions are disclosed below. Once prepared, however, the bis-diazonium salts of this invention are stable thermally and can be used to prepare crosslinkable-photosensitive compositions and elements in further accord with this invention.

The colloids which are useful in the compositions and elements of this invention are synthetic or natrually occurring, and have pendant, recurring hydroxyl groups or amino groups, e.g., polymeric polyols, or natural colloids such as gelatin, glue, shellac; addition polyesters, e.g., polyacrylic and polymethacrylic acid esters; polyvinyl alcohol, poly-p-aminostyrene, etc.

The crosslinkable-photosensitive layer preferably has a thickness of 0.00005 to 0.003 inch or more, and a support or protective film, if used, a thickness of 0.00025 to 0.005 inch or more.

Crosslinkable-photosensitive elements useful in this invention can be made by coating a solution or dispersion of the crosslinkable-photosensitive organic composition onto a thin, flexible, smooth film base or support and drying the layer by removal or evaporation of any volatile solvent or diluent. The support preferably is strong, transparent to actinic radiation, dimensionally stable to temperature changes, and has good resistance to solvent action by common solvents. The support should be such, that there is only a moderate amount or degree of adherence between the coating and the support, so that the support can be easily stripped in dry condition from the crosslinkable-photosensitive organic coating or layer.

A protective film may be applied by pressing or laminating, e.g., by passing the sheet and the coated crosslinkable element between rolls. The protective film, if used should have a lesser degree of adherence to the layer than the support.

The crosslinkable-photosensitive elements of this invention comprising a stratum having a surface that is in surface contact with the crosslinkable-photosensitive layer on the adherent film support, are prepared by first removing the protective sheet, if used, from the cross-linkable-photosensitive layer. The crosslinkable-photosensitive layer is then brought into contact with the surface. This can be done by the pressing or laminating procedure used for applying the protective film or sheet.

A preferred embodiment of the element of this invention is prepared by coating a layer of the crosslinkable-photosensitive composition described herein on a suitable transparent film support. After drying the crosslinkable-photosensitive layer, there is laminated to the surface thereof a strippable cover film. The crosslinkable-photosensitive composition is coated to give a dry coating thickness of about 0.0005 inch, although this may be varied readily from 0.001 inch or less to 0.005 inch or more. A suitable support film may be chosen from a wide variety of films or foils composed of metals or high polymers, e.g., polyamides, polyolefins, polyesters, vinyl polymers, and cellulose esters and may have a thickness of from 0.00025 inch to 0.005 inch or more. If exposure is to be made before removing the support film, it must, of course, transmit a substantial portion of the actinic radiation incident upon it. No such restrictions apply if the support film is removed prior to exposure. Transparent polyethylene terephthalate is a particularly suitable film, in a thickness of about 0.001 inch. Other suitable removable cover films if used, may be chosen from the group of high polymer films set forth above, and may have the same wide range of thicknesses. The cover sheet preferably has a lesser degree of adherence to the crosslinkable-photosensitive layer than does the support. Support and cover films provide protection to the crosslinkable-photosensitive composition.

When the element is ready for use, the cover film is stripped off. The crosslinkable-photosensitive film is then laminated to a solid support having a smooth surface, e.g., metal, glass, etc. with heated resilient pressure rolls. This provides a sensitized crosslinkable-photosensitive element which is ready for exposure, but nonetheless protected from environmental contaminants due to the original support film.

The element is used as described in Assignee's Cohen and Heiart, U.S. application, filed June 16, 1969, Ser. No. 833,740, substantially as follows. The element is exposed imagewise, preferably through the support film. The support is then peeled away, and the unexposed area is reacted with the fumes of ammonia or an organic amine. The element is then developed by washing away the unhardened exposed areas with solvent. Either an aqueous or an organic solvent may be used in the development process depending on the nature of the colloid used in the crosslinkable-photosensitive composition. An aqueous solvent is used when the colloid is a hydrophilic compound, and an organic solvent is used when the colloid is a hydrophobic, oleophilic compound.

The washed out element is useful as a relief or a positive working resist image.

The following examples are intended to further illustrate the invention, however, the scope of the invention is not intended to be limited thereby.

EXAMPLE I

A novel bis-diazonium salt in accord with this invention is prepared as follows: 0.5 mole p-nitrobenzoylchloride and 0.2 mole 1,4-butanediol are refluxed in benzene for 18 hours. A diester (identified by infrared spectra) was precipitated by addition of N-hexane. The white precipitate (20 grams) was reduced in 250 ml. of ethanol with 1 gram palladium over carbon, under 4 atmospheres of hydrogen at room temperature.

Infrared spectroscopy of the product showed a disappearance of the peak at 7.45$\mu$ ($NO_2$ band) and appearance of the band at 5.1$\mu$ ($NH_2$ band). Then 0.1 mole of the (1,4 butanediol)dibenzoate-4, 4'-bis amine was diazotized with sodium nitrite, and zinc chloride, in 25 ml of hydrochloric acid at 10°C. The product was verified as (1,4-butanediol) dibenzoate-4,4'-bis(diazonium zinc chloride).

EXAMPLE II

One-half gram of (1,4-butanediol) dibenzoate-4,4'-bis(diazonium zinc chloride) was dissolved in 25 ml. of acetone containing 2.5 grams poly(methylmethacrylate/hydroxyethyl methacrylate) (MW≈30,000; 90 mole per cent methylmethacrylate), 0.5 gram p-toluenesulfonic acid, 1.0 gram triethylene glycol diacetate, 2 cc. of ethanol, and 1 ml. of water.

The material was coated on 0.001 inch polyethylene terephthalate to a thickness of 0.0005 inch.

The coated element was allowed to dry at room temperature and then laminated to a copper-clad epoxy resin Fiberglas board by means of heated rollers at 120°C., the photosensitive layer being adhered to the copper. The polyester support sheet was stripped away and the crosslinkable-photosensitive layer adhering to the copper was exposed for 2 minutes through a process negative at a distance of 24 inches to a 2,500-watt, 14-ampere carbon arc. The layer was treated with ammonia fumes, and the resulting image was washed out in the exposed areas by means of 1,1,1-trichloroethane. After etching in ferric chloride, a positive copper image remained.

EXAMPLE III

The same mixture was prepared as in Example II, except that 2.0 grams of polyvinyl alcohol (99–100percent hydrolyzed; 4percent aqueous solution viscosity, 55–65 centepoise) was used instead of the copolymer compound. The composition was coated and dried as in Example II.

The coated element was then laminated to a glass plate, exposed and processed as in Example II, except that hot water was used to wash out the exposed areas. The plate was suitable for use as a positive working relief image.

EXAMPLE IV

Example III was repeated, except that a coated element was laminated to a steel plate and to an aluminum plate, each being 0.004 inch thick. The resulting plates were suitable for use as positive working resist images.

EXAMPLE V

Using the method of Example I the following salts useful in preparing crosslinkable-photosensitive compositions were made by substituting respective diols and nitroaroyl chlorides for 1,4-butanediol and p-nitrobenzoyl chloride:

(1,5-pentanediol)dinaphthoate-5,5'-bis(diazonium zinc chloride)

(1,3-isobutanediol)dibenzoate-4,4'-bis(diazonium zinc chloride)

resorcinol dibenzoate-4,4'-bis(diazonium zinc chloride)

Other useful salts can be made by substituting other polymethylene glycols or dihydroxy aromatic compounds for the above diols and by substituting other nitroaroyl chlorides.

A mixture of each of these salts in poly(methylmethacrylate/hydroxyethyl methacrylate) was prepared, coated and laminated as in Example II and upon exposure and treatment with methylamine fumes, the resulting image was washed out in the exposed areas by means of 1,1,1-trichloro-ethane. After etching in ferric chloride, a positive copper image remained.

EXAMPLE VI

A novel sulfonate ester bis-diazonium salt in accord with this invention was prepared as follows: One/tenth mole of 1-nitro-2-methylnaphthalene-6-sulfonyl chloride in 100 ml. benzene was refluxed for 24 hours with 0.04 mole 1,4-butanediol. A disulfonate ester which was identified by by IR spectra was precipitated by addition of 500 ml n-hexane. Then 0.02 mole of the bis-nitro-diester was reduced in 200 ml ethanol with 10 percent palladium on carbon under 5 atmosphere of hydrogen at 45°C. The bis-amine which was identified by IR spectra was precipitated by addition of water. The precipitate was dissolved in excess hydrochloric acid and diazotized with sodium nitrite. The hydrochloride salt was treated with 70 ml. of 40 percent fluoboric acid to give the fluoborate salt, (1,4-butanediol) dinaphthyl-6-sulfonate-2,2'-bis-[methyl]-1,1'-bis(diazonium fluoborate).

One-half gram of this bis-diazonium salt in a water-methanol (5 g: 1 g) solution was mixed with 5 g of polyvinyl alcohol which was 88.2–89.2 percent hydrolyzed, 50 g. water, 0.2 g. citric acid and 1 g. triethyleneglycol diacetate. This composition was then coated on 0.001 inch polyethylene terephthalate support to a thickness of 0.005 inch and, after drying at room temperature, was laminated at 50°C. with a 0.00025 inch polyethylene protective film.

After 3 days, the polyethylene protective film was stripped away and the crosslinkable-photosensitive element was laminated, exposed, and processed as in Example II, except that hot water was used to wash out the exposed areas. The plate was suitable for use as a positive working relief image.

EXAMPLE VII

Naphthalene-1,5-bis(diazonium fluoborate) which is useful in this invention was prepared as follows: 0.1 mole 1,5-naphthylenediamine was stirred with 28 g. sodium nitrite in 250 ml concentrated sulfuric acid at 10°C for 1 hour and was then poured into 1 liter of ice water. The resulting bis-(diazonium sulfate), dissolved in 2 liters of water, was converted to naphthalene-1,5-bis(diazonium fluoborate) by the addition of 70 ml 40 percent fluoboric acid.

The following bis-(diazonium fluoborate) salts useful in this invention can be made from the corresponding diamines using the procedure of Example VII.

benzene-1,4-bis(diazonium fluoborate)

benzene-1,3-bis(diazonium fluoborate)

naphthalene-1,5-bis(diazonium fluoborate)-7-sulfonic acid anthracene-1,6-bis(diazonium fluoborate)

anthracene-1,5-bis(diazonium fluoborate)-7-sulfonic acid anthraquinone-1,6-bis(diazonium fluoborate)

phenanthrene-1,5-bis(diazonium fluoborate)

fluorene-2,7-bis(diazonium fluoborate)

acenaphthene-4,6-bis(diazonium fluoborate)

2,6-dimethoxypyridine-3,5-bis(diazonium fluoborate)

pyrazole-3,5-bis(diazonium fluoborate)

biphenyl-4,4'-bis(diazonium fluoborate)-2,2'-bis(sulfonic acid)

2,2'-dimethyl-biphenyl-4,4'-bis(diazonium fluoborate)

1,2 diphenylethane-4,4'-bis(diazonium fluoborate)
1,3 diphenylisobutane-4,4'-bis(diazonium fluoborate)
p-terphenyl-4,4'-bis(diazonium fluoborate)
diphenylsulphone-4,4'-bis(diazonium fluoborate)

EXAMPLE VIII

An ethanol-water (10 g: 2 g) solution of 1 g. naphthalene-1,5-bis(diazonium fluoborate) was added to a well stirred solution of 2.5 g.polyvinylbutyral (hydroxyl content 18–20 percent and butyral content 80 percent), 0.3 g. citric acid, and 0.8 g. triethylene glycol diacetate in 50 g ethanol. This solution was coated on 0.00075 inch polyethylene terephthalate film support to a thickness of 0.002 inch and, after drying at room temperature, a piece was laminated to a sheet of red, anodized aluminum plate by slowly passing the plate and supported crosslinkable-photosensitive composition between two rollers heated to 110°C. The material was then exposed through a process negative and the transparent polyester support for 1 minute to a 500-watt mercury arc (PEK 500) at 16 inches. The polyester sheet was removed and the coated plate was treated with ammonia fumes which crosslinked the unexposed areas of the photosensitive-crosslinkable layer. The uncrosslinked areas were washed out in a spray of 2-(2-ethoxy) ethanol. The plate was then rinsed in water and treated with 5 percent sodium hydroxide solution at 70°C.to give a shiny aluminum image in exposed areas. The resist was then removed with methylene chloride.

EXAMPLE IX

Diphenylmethane-4,4'-bis(diazonium fluoborate) was prepared from the corresponding diamine using the procedure in Example VII. The procedure in Example VIII was repeated with this salt except that the polymer binder was polyvinyl formal with 7–9 percent hydroxy content and 80 percent formal content.

EXAMPLE X

An ethanol-water (10 g: 1 g.) solution of 1 g. biphenyl-4,4'-bis(diazonium fluoborate), which was prepared from the corresponding diamine as in Example VII, was added to a solution of 2.5 g. hydroxypropyl cellulose, 0.5 g. propylene glycol, 0.5 g.citric acid in 50 g ethanol. The resulting crosslinkable-photosensitive composition was coated and dried as in Example VIII and was then laminated at 50°C with a 0.00025 inch polyethylene protective film. Two days later the protective film was stripped away and the crosslinkable-photosensitive material was laminated to an acid cleaned glass plate using rollers heated to 130°C. the crosslinkable-photosensitive layer being adhered to the glass. The polyester support film was stripped away and the plate was exposed through a process negative for 1.5 minute at 16 inches to a 1,000-watt-Xenon arc lamp (nuArc Platemaker). After treatment for 7 minutes with ammonia fumes, the exposed areas were washed out with a spray of 2-methoxyethanol. The plate with coating was heated at 150°C for 10 minutes and then etched in 25 percent aqueous hydrofluoric acid giving a positive image when the remaining resist was removed.

EXAMPLE XI

Azobenzene-4,4'-bis(diazonium fluoborate) which is useful in crosslinkable-photosensitive compositions of this invention was prepared as follows: p-Nitroaniline (27.6 g.) was acetylated in excess acetic anhydride and the nitro groups of the resulting p-nitroacetanilide were reduced to the amine as in Example VI. Then 0.2 mole of p-aminoacetanilide was diazotized in hydrochloric acid with sodium nitrite and coupled with 0.2 mole of p-amino acetanilide to give the symmetric azo acetanilide. This azo compound was hydrolyzed in acid and further diazotized using the above procedure to give azobenzene-4,4'-bis(diazonium hydrochloride) which was converted to the fluoborate salt by treatment with 70 ml, 40 percent fluoboric acid.

EXAMPLE XII

An ethanol-water solution (10 g: 0.5 g.) of 1 g. azobenzene-4,4'-bis(diazonium fluoborate) was added to a well stirred solution of 25 g.cellulose acetate butyrate (one-half second material), 0.5 g.p-toluene sulfonic acid, and 0.5 g. triethyleneglycoldiacetate in 30 g.acetone.

The crosslinkable-photosensitive composition was coated on 0.001 inch polyethylene terephthalate to a thickness of 0.002 inch and laminated to a copper-clad epoxy resin Fiberglas board by means of heated rollers at 130°C, the crosslinkable-photosensitive layer being adhered to the copper. The colored layer was exposed for 30 seconds through a process negative at a distance of 16 inches to a 1,000 watt, quartz-iodine lamp (Sylvania SG-60 Sun Gun) producing a visible image by bleaching the exposed areas. The polyester support sheet was stripped away, the exposed layer adhering to the copper was treated with ammonia fumes, which accentuated the visible image. The exposed areas were washed out by means of 2-(2-ethoxy) ethanol. After etching in ferric chloride at 63°C followed by removing the crosslinked unexposed area with methylene chloride, a copper image remained on the Fiberglas board which could be used as a circuit board.

EXAMPLE XIII

An ethanol-water (15 g: 1 g.)solution of 1.5 g. acridine-3,6-bis(diazonium fluoborate), which was prepared from the corresponding diamine as in Example VII, was added to a well stirred solution of 15 g partially acetylated polyvinyl alcohol (viscosity 900–1,200 centipoise), 1 g. triethyleneglycol diacetate, and 0.5 g citric acid in 33 g. water.

The crosslinkable-photosensitive composition was coated and laminated with a protective cover sheet as in Example VIII. Later the protective cover sheet was stripped away and the coated support sheet was laminated to a magnesium metal plate by means of heated rollers at 80°C. The polyester support sheet was stripped away and the crosslinkable-photosensitive layer adhering to the magnesium plate was exposed for 2.5 minutes through a half-tone negative at a distance of 24 inches to a 2,500-watt, 14 ampere carbon arc (nuArc Platemaker). The exposed layer was treated with methylamine and the exposed uncrosslinked areas were washed out with 2-(2-ethoxy) ethanol-water solution (50:50). The plate was rinsed in water and then the exposed portions were etched for 5 minutes with 10 percent nitric acid solution. After removing the remaining crosslinked layer, the plate with etched image is useable for printing.

EXAMPLE XIV

A solution of 7 g.(1,4-butanediol) dibenzoate-4,4'- bis(diazonium zinc chloride), 1 g.citric acid in 20 ml ethanol and 30 ml water was added to a solution at 27°C.of 30 g.gelatin in 300 ml deionized water and 1 ml 10 percent aqueous saponin. After stirring for 30 minutes, the solution was skim coated on 0.001 inch flame-treated polyethylene terephthalate. The resulting layer was chilled and dryed and then laminated to a copper-clad epoxy resin Fiberglas by means of heated rollers at 50°C, the crosslinkable-photosensitive layer being adhered to the copper. Two hours later, the layer was exposed, the support film stripped off and treated with ammonia fumes, as in Example II, and the resulting image was carefully washed out using water at 60°C. After etching in ferric chloride, a positive copper image remained.

EXAMPLE XV

An ethanol-water (10 g: 10 g.) solution of 5 g. naphthalene-1,5-bis(diazonium fluoborate) was added to a solution of 20 g.poly p-aminostyrene, 5 g.polymethylmethacrylate (MW ≈ 60,000), 7 g.triethyleneglycol diacetate, and 0.7 g.p-toluenesulfonic acid, in 50 g.acetone and 10 g.ethanol. This crosslinkable-photosensitive composition was coated as in Example II and laminated at 120°C.to a zinc metal sheet cleaned with pumice. The material was then exposed through a process negative and the transparent polyester support for 10 seconds to a 500 watt mercury arc (PEK 500) at 16 inches. The support film was stripped away and the layer was treated with ammonia fumes. The resulting image was washed out with methyl chloroform and the positive image produced was etched using 5 percent nitric acid.

The embodiments of the invention in which an exclusive property or privilege is claimed are defined as follows:

1. A positive working, crosslinkable photosensitive composition comprising a mixture of 1. a photosensitive bis-diazonium salt wherein the cation portion of the salt is of the formula:

$$^{+}N \equiv N - R' - Y - (CH_2)_n - Y - R' - N \equiv N^{+}$$

wherein R' is benzene, napthalene, anthracene, or phenathrene, $Y$ is —COO— or —$SO_3$— and $R'$ is attached to the carbon or sulphur atom of —COO— or —$SO_3$— respectively, $n$ is a cardinal number of at least 4, and the anion portion of the salt is an anion of an inorganic salt, and 2. a polymer cross-linkable in the presence of said bis-diazonium salt in a basic environment, the polymer consisting of a substantially unhardened, macromolecular organic colloid having pendant recurring hydroxyl or amino groups.

2. A composition according to claim 1 wherein the salt is a zinc chloride salt.

3. A composition according to claim 1 wherein the salt is a fluoborate salt.

4. A composition according to claim 1 wherein said colloid is gelatin.

5. A composition according to claim 1 wherein said colloid is polyvinyl alcohol.

6. A composition according to claim 1 wherein said salt is (1,4-butanediol)dibenzoate-4,4'-bis(diazonium zinc chloride).

7. A composition according to claim 1 wherein said salt is (1,5-pentanediol)dinaphthoate-5,5'-bis(diazonium zinc chloride).

8. A composition according to claim 1 wherein said salt is (1,4-butanediol)dinaphthylsulfonate-4,4'-bis(diazonium fluoborate).

9. A photosensitive resist-forming element comprising a support bearing a layer of photosensitive composition according to claim 1.

10. An element according to claim 9 having a protective cover sheet on said layer.

* * * * *